(12) United States Patent
Zhu et al.

(10) Patent No.: US 7,684,197 B2
(45) Date of Patent: Mar. 23, 2010

(54) MEMORY MODULE ASSEMBLY HAVING HEAT SINKS WITH IMPROVED STRUCTURE

(75) Inventors: Xiao-Yan Zhu, Shenzhen (CN); Cui-Jun Lu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/143,847

(22) Filed: Jun. 23, 2008

(65) Prior Publication Data

US 2009/0316352 A1 Dec. 24, 2009

(51) Int. Cl.
*H05K 7/20* (2006.01)

(52) U.S. Cl. ............ 361/719; 361/704; 361/715; 257/718; 257/719; 165/80.3; 165/185

(58) Field of Classification Search .......... 361/704, 361/707, 715, 719, 720; 165/80.3, 185; 257/712, 257/718, 719
See application file for complete search history.

(56) References Cited

U.S. PATENT DOCUMENTS

| | | | | |
|---|---|---|---|---|
| 5,892,655 | A * | 4/1999 | Grouell | 361/690 |
| 6,615,910 | B1 * | 9/2003 | Joshi et al. | 165/80.3 |
| 7,221,569 | B2 * | 5/2007 | Tsai | 361/704 |
| 7,262,971 | B2 * | 8/2007 | Chen | 361/719 |
| 7,349,219 | B2 * | 3/2008 | Lai et al. | 361/719 |
| 7,349,220 | B2 * | 3/2008 | Lai et al. | 361/719 |
| 7,375,964 | B2 * | 5/2008 | Lai et al. | 361/704 |
| 7,391,613 | B2 * | 6/2008 | Lai et al. | 361/700 |
| 7,400,506 | B2 * | 7/2008 | Hoss et al. | 361/715 |
| 7,457,122 | B2 * | 11/2008 | Lai et al. | 361/704 |
| 7,480,147 | B2 * | 1/2009 | Hoss et al. | 361/721 |
| 7,532,477 | B2 * | 5/2009 | Hsu | 361/704 |
| 2003/0026076 | A1 * | 2/2003 | Wei | 361/704 |

* cited by examiner

*Primary Examiner*—Boris L Chervinsky
(74) *Attorney, Agent, or Firm*—Frank R. Niranjan

(57) ABSTRACT

A memory module assembly includes a printed circuit board having a plurality of heat-generating electronic components thereon, first and second heat sinks formed by stamping a metal sheet and attached on opposite sides of the printed circuit board and a clamp clamping the first, second heat sinks and the printed circuit board together. The first and second heat sinks each comprise a plurality of fins extending therefrom and define a plurality of openings between the fins. The fins and openings are alternately arranged on each of the first and second heat sinks along a height direction thereof. The second heat sink includes a pair of positioning tongues extending from opposite side edges thereof. The first heat sink engages with the second heat sink via the positioning tongues of the second heat sink extending in and engaging with the first heat sink.

10 Claims, 3 Drawing Sheets

US 7,684,197 B2

MEMORY MODULE ASSEMBLY HAVING HEAT SINKS WITH IMPROVED STRUCTURE

BACKGROUND OF THE INVENTION

1. Field of the Invention

The present invention relates generally to memory module assemblies, and more particularly to a memory module assembly including a heat sink attached to a printed circuit board of the memory module assembly and having a plurality of fins alternated with openings through the heat sink, wherein the heat sink is formed by stamping a metal sheet.

2. Description of Related Art

Memory module assemblies that are currently in use generally do not require cooling devices to dissipate heat. The electronic components and memory module assemblies currently available, which are operated on or below 66 MHz do not generate heat that requires a cooling device for dissipating the heat. However, as the industry progresses, memory module assemblies, such SDRAM DIMM memory module assemblies are required to be operated at 100 MHz or more. For these modern memory module assemblies, heat sinks will be required to remove heat generated thereby.

Conventionally, an aluminum extrusion-type heat sink having a plurality of fins is used to attach to a printed circuit board to remove heat therefrom. However, the aluminum extrusion-type heat sink usually has disadvantages of high cost and heavy weight.

What is needed, therefore, is a memory module assembly having heat sinks which can overcome the above-mentioned disadvantages.

SUMMARY OF THE INVENTION

The present invention relates to a memory module assembly. According to a preferred embodiment of the present invention, the memory module assembly includes a printed circuit board having a plurality of heat-generating electronic components thereon, first and second heat sinks attached on opposite sides of the printed circuit board and a clamp clamping the first, second heat sinks and the printed circuit board together. Each of the first and second heat sinks is formed by stamping a metal sheet. The first heat sink comprises a plurality of fins extending therefrom and defines a plurality of openings adjacent to the fins. The fins and openings are alternately arranged on the first heat sink along a direction from a top side to an opposite bottom side of the first heat sink. The second heat sink has a configuration similar to the first heat sink. Nevertheless, the second heat sink includes a pair of positioning tongues extending from opposite side edges thereof toward the first heat sink and the first heat sink has a pair of ears extending outwardly from opposite side edges thereof. The first heat sink engages with the second heat sink via the positioning tongues of the second heat sink extending in and engaging with the ears of the first heat sink.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
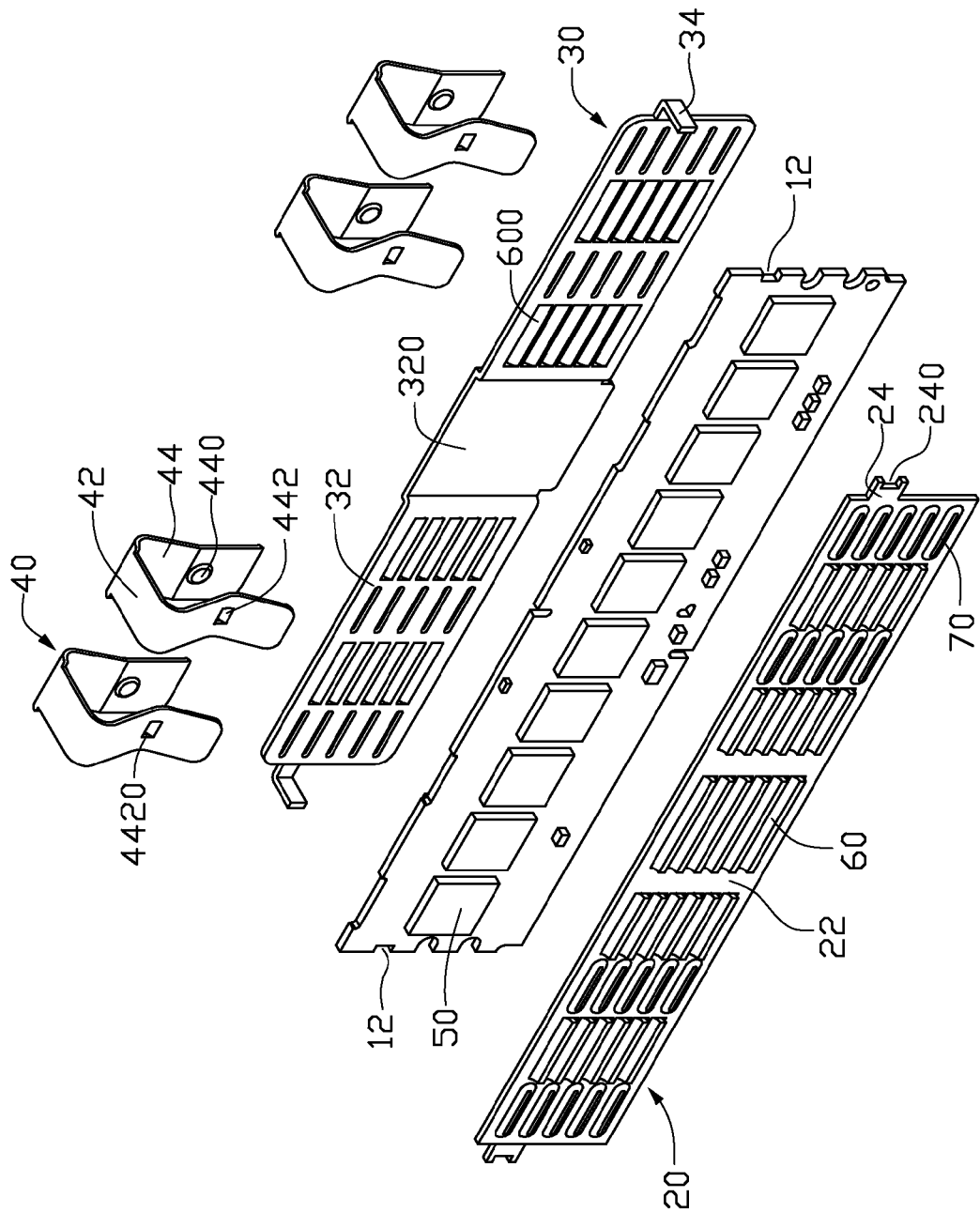
FIG. 1 is an exploded view of a memory module assembly in accordance with a preferred embodiment of the present invention.
Figure 2:
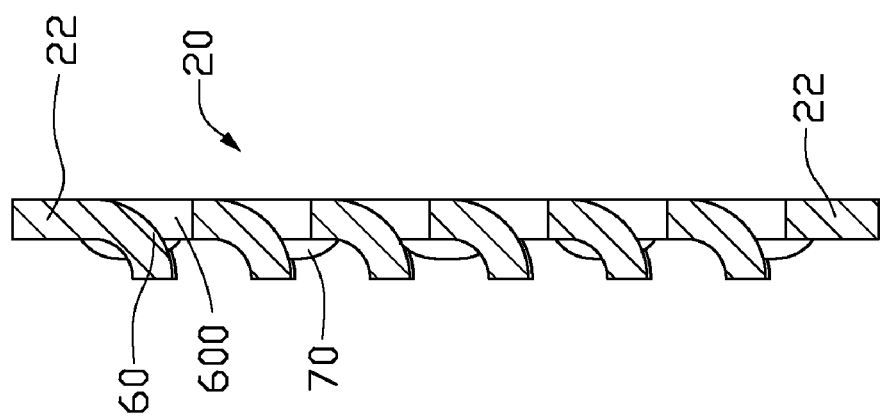
FIG. 2 is a cross-sectional view of a first heat sink of the memory module assembly of FIG. 1.
Figure 3:
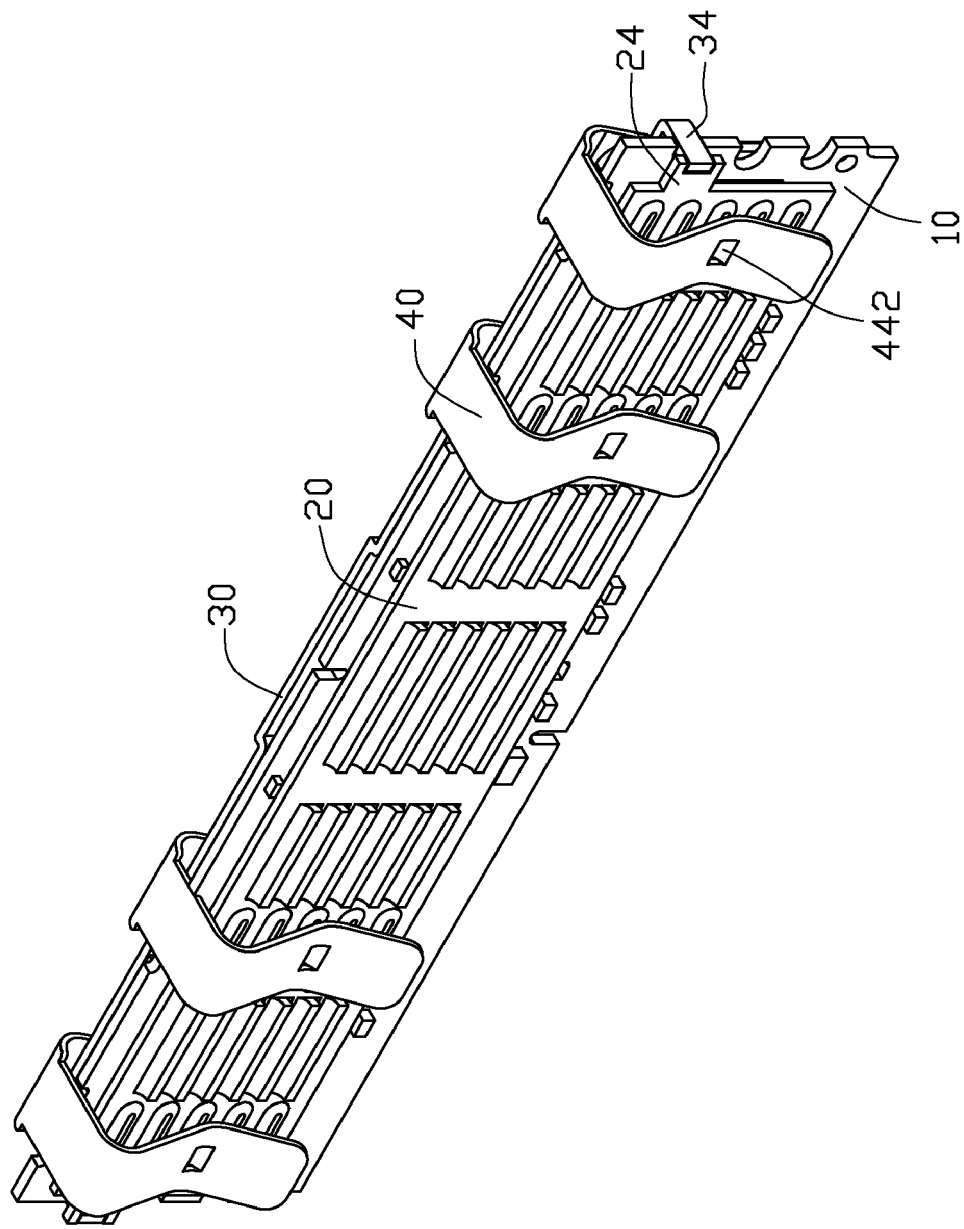
FIG. 3 is an assembled view of the memory module assembly of FIG. 1.

FIGS. 1-2 illustrate a memory module assembly in accordance with a preferred embodiment of the present invention. The memory module assembly comprises a printed circuit board 10 having a plurality of heat-generating electronic components 50 thereon, a first heat sink 20, a second heat sink 30 and four clamps 40 for securing the first and second heat sinks 20, 30 onto opposite sides of the printed circuit board 10. Each of the first and second heat sinks 20, 30 is formed by stamping a metal sheet. The printed circuit board 10 has a rectangular shape having first and second faces and two long top and bottom sides and two short lateral sides between the long top and bottom sides. A pair of recesses 12 is defined in edges of the opposite short lateral sides of the printed circuit board 10. The printed circuit board 10 further comprises a main heat-generating electronic component (not shown) producing more heat than any one of the heat-generating electronic components 50. The main heat-generating electronic component is arranged facing the second heat sink 30 and located at a middle of a rear surface of the printed circuit board 10, opposite the heat-generating electronic components 50 shown in FIG. 1.

Referring to FIG. 2, the first heat sink 20 comprises a rectangular-shaped first body 22. A pair of ears 24 extends outwardly from edges of a pair of opposite short sides of the first body 22 of the first heat sink 20. Each ear 24 defines a cutout 240 therein. A plurality of groups of rectangular fins 60 are formed on the first body 22. The groups are arranged along a lateral, lengthwise direction of the first heat sink 20. Each group comprises a plurality of fins 60 arranged on the first body 22 in a row along a top-to-bottom (height) direction the first heat sink 20. The fins 60 are formed by punching the first body 22 from a rear face of the first body 22 to a front face of the first body 22 of the first heat sink 20. Thus, the fins 60 protrude from the front face of the first body 22 and depress at the rear face of the first body 22 of the first heat sink 20. A plurality of rectangular openings 600 are defined in the first body 22 of the first heat sink 20 and each immediately adjacent to a corresponding fin 60. The fins 60 and the openings 600 are alternately arranged on the first body 22 along the top-to-bottom direction of the first heat sink 20. The fins 60 and the openings 600 are extended along horizontal, parallel lines, respectively. With the fins 60 of the first heat sink 20 being formed by punching the first body 22 of the first heat sink 20 to obtain the openings 600, the fins 60 are bent toward the long bottom side of the first body 22 of the first heat sink 20 and each fin 60 has an arc-shaped structure. Every two adjacent fins 60 define an airflow channel (not labeled) communion with a corresponding opening 600 thereby to enhance flowing of airflow passing through the fins 60 of the first heat sink 20. Two groups of ribs 70 are formed on the front face of the first body 22 of the first heat sink 20 and positioned outside two outmost groups of the fins 60. Two other groups of ribs 70 each is located between a corresponding outmost group of the fins 60 and a neighboring group of the fins 60. Each group of the ribs 70 comprises a plurality of ribs 70 parallel to each other and arranged in a row along the top-to-bottom direction of the first body 22 of the first heat sink 20. The ribs 70 are stamped from the rear face of the first body 22 to the front face of the first body 22 of the first heat sink 20. Thus, the ribs 70 protrude from the front face of the first body 22 and depress at the rear face of the first body 22 of the first heat sink 20. The ribs 70 are used to engage with the clamps 40.

The second heat sink 30 is similar to the first heat sink 20 expect that the second heat sink 30 comprises a pair of positioning tongues 34 perpendicularly extending from edges of a pair of opposite short sides of a second body 32 thereof. The tongues 34 are configured and positioned corresponding to the cutouts 240 of the ears 24 of the first body 22 of the first heat sink 20. The positioning tongues 34 are used to extend through the recesses 12 of the printed circuit board 10 and engage in the cutouts 240 of the ears 24 of the first body 22 of the first heat sink 20 to connect the first heat sink 20 and the second heat sink 30 together. A depressed region 320 is defined in the second body 32 of the second heat sink 30 to accommodate the main one (not shown) of the heat-generating electronic components 50 mounted on the middle of the rear surface of the printed circuit board 10.

Each clamp 40 has an n-shaped configuration and comprises a connecting portion 42 and a pair of elastic pressing portions 44 extending downwardly from front and rear ends of the connecting portion 42. Each pair of the pressing portions 44 forms a round protrusion 440 and a tab 442 extending inwardly from inner surfaces thereof and the tab 442 is located in front of the protrusion 440. The tabs 442 of the clamps 40 are locked in depressions defining between two adjacent ribs 70 of the first heat sink 20 and the tabs 440 are used to engage with bottoms of the ribs 70 of the second heat sink 30 to avoid movements of the clamps 40 along a bottom-to-top direction of the printed circuit board 10. Each tab 442 is formed by stamping the pressing portion 44 of the clamp 40 so that a rectangular bore 4420 is defined in the pressing portion 44 and immediately adjacent to the tab 442. Each tab 422 extends inclinedly, upwardly and inwards from the corresponding pressing portion 44.

In assembly, the first and second heat sinks 20, 30 respectively contact with the first and second faces of the printed circuit board 10. The second heat sink 30 is attached on the main heat-generating electronic component so that the main heat-generating electronic component (not shown) is received in the depressed region 320 of the second body 32 of the second heat sink 30. The positioning tongues 34 of the second heat sink 30 extend into the recesses 12 in the printed circuit board 10 and the cutouts 240 in the first heat sink 20. Then, free ends of the positioning tongues 34 extending in the cutouts 240 of the ears 24 of the first body 22 of the first heat sink 20 are bent to tightly abut against the front surface of the first body 22 of the first heat sink 20. The printed circuit board 10 is sandwiched between the first and second heat sinks 20, 30 by the clamps 40. The pressing portions 44 of the clamps 40 resiliently engage with the first body 22 of the first heat sink 20 and the second body 32 of the second heat sink 30. The protrusions 440 of the pressing portions 44 of the clamp 40 engage with the second body 32 of the second heat sink 30 and located between two corresponding adjacent ribs 70 of the second heat sink 30. Free ends of the tabs 442 of the pressing portions 44 of the clamps 40 engage the bottoms of the corresponding ribs 70 of the first heat sink 20. Therefore, the clamps 40 securely clamp the first, second heat sink 20, 30 and the printed circuit board 10 therebetween. Furthermore, the clamps 40 push the first and second heat sinks 20, 30 toward the printed circuit board 10 so that the first and second heat sinks 20, 30 can have an intimate contact with the electronic components 50.

In the present invention of the memory module assembly, since each of the first and second heat sinks 20, 30 is designed by stamping a metal sheet, a thickness of each of the first and second heat sinks 20, 30 is less than 6 mm. The fins 60 stamped from each of the first and second heat sinks 20, 30 each also have a thickness less than 6 mm, which is smaller than that of each fin of a conventional aluminum extrusion-type heat sink. With the smaller thickness of the fins 60 of the first and second heat sinks 20, 30, the cost of the whole memory module assembly is accordingly lowered. In addition, the weight of the first and second heat sinks 20, 30 is light, in comparison with the prior aluminum extrusion-type heat sinks. An airflow generated by a system fan (not shown) can directly flow towards the printed circuit board 10 through the opening 600 in the first and second heat sinks 20, 30 and heat transfer between the first and second heat sinks 20, 30 and the electronic components 50 on the printed circuit board 10 and the airflow is increased, thereby further enhancing the heat dissipation efficiency of the first and second heat sinks 20, 30.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A memory module assembly comprising:
    a printed circuit board having a plurality of heat-generating electronic components mounted thereon;
    a first heat sink formed by stamping a metal sheet and comprising a first body attached on a side of the printed circuit board and a plurality of fins and openings alternately arranged on the first body;
    a second heat sink formed by stamping a metal sheet and comprising a second body attached on an opposite side of the printed circuit board, a pair of positioning tongues extending from opposite sides of the second body and a plurality of fins and openings alternately arranged on the second body; and
    a clamp comprising a connecting portion and a pair of elastic pressing portions extending from two ends of the connecting portion, a protrusion and a tab extending inwardly from a pair of opposite inner surfaces of the pair of pressing portions;
    wherein the pressing portions clamp the first and second heat sinks attached to the opposite sides of the printed circuit board and resiliently press the first and second heat sinks toward the heat-generating electronic components, the first heat sink engaging with the second heat sink via the positioning tongues of the second heat sink extending in the first heat sink; and
    wherein the first and second bodies each comprise a plurality of ribs extending from a surface thereof, the protrusion being located between two corresponding adjacent ribs of the second body, and a free end of the tab engaging a bottom of a corresponding rib of the first body.

2. The memory module assembly as claimed in claim 1, wherein the fins of the first heat sink each have a thickness less than 6 mm.

3. The memory module assembly as claimed in claim 2, wherein the openings communicate with channels defined between every two adjacent fins of the first heat sink.

4. The memory module assembly as claimed in claim 1, wherein the first body of the first heat sink defines a pair of cutouts in edges of a pair of opposite sides thereof and the positioning tongues of the second heat sink extend in the cutouts of the first heat sink.

5. The memory module assembly as claimed in claim 1, wherein the first body of the first heat sink comprises a pair of ears extending outwardly from edges of a pair of opposite sides thereof and the positioning tongues of the second heat sink extend in the ears of first body of the first heat sink.

6. The memory module assembly as claimed in claim 1, wherein each fin has an arc-shaped structure.

7. The memory module assembly as claimed in claim 1, wherein the second body of the second heat sink defines a depressed region in a face thereof facing the printed circuit board, the depressed region receiving a main one of the heat-generating electronic components therein.

8. A memory module assembly, comprising:
 a printed circuit board having a plurality of heat-generating electronic components mounted on opposite surfaces thereof;
 first and second heat sinks formed by stamping a metal sheet and covering the opposite surfaces of the printed circuit board and thermally connecting with the heat-generating electronic components, the first and second heat sinks each comprising a plurality of fins outwardly extending therefrom, a plurality of openings defined therethrough and a plurality of ribs extending outwardly and located between the fins; and
 a pair of substantially n-shaped clamps each having a pair of elastic pressing portions clamping the first and second heat sinks on the opposite surfaces of the printed circuit board;
 wherein the fins and the openings of each of the first and second heat sinks are alternately arranged on the each of the first and second heat sinks along a height direction of the printed circuit board; and
 wherein a protrusion and a tab extend inwardly from a pair of opposite inner surfaces of the pair of pressing portions, and the protrusion is located between two corresponding adjacent ribs of the second heat sink, and a free end of the tab engages a bottom of a corresponding rib of the first heat sink.

9. The memory module assembly as claimed in claim 8, wherein the second heat sink comprises a positioning tongue and the first heat sink comprises an ear extending from a side edge thereof and the positioning tongue engages with the ear to secure the printed circuit board between the first and second heat sinks.

10. The memory module assembly as claimed in claim 8, wherein each of the fins of each of the first and second heat sinks is immediately adjacent to a corresponding opening, each of the fins being bent toward a bottom side of a corresponding one of the first and second heat sinks.

* * * * *